(12) United States Patent
Ishida et al.

(10) Patent No.: US 7,826,332 B2
(45) Date of Patent: Nov. 2, 2010

(54) LIGHT-RECEIVING ELEMENT, OPTICAL HEAD USING THE SAME, AND OPTICAL RECORDING/REPRODUCING APPARATUS USING THE SAME

(75) Inventors: Tomohiko Ishida, Tokyo (JP); Jun Ono, Tokyo (JP)

(73) Assignee: TDK Corporation, Tokyo (JP)

( * ) Notice: Subject to any disclaimer, the term of this patent is extended or adjusted under 35 U.S.C. 154(b) by 585 days.

(21) Appl. No.: 11/889,444

(22) Filed: Aug. 13, 2007

(65) Prior Publication Data
US 2008/0049565 A1    Feb. 28, 2008

(30) Foreign Application Priority Data
Aug. 25, 2006    (JP) .............................. 2006-229510

(51) Int. Cl.
*G11B 7/00* (2006.01)
(52) U.S. Cl. ...................................... 369/120
(58) Field of Classification Search ........................ None
See application file for complete search history.

(56) References Cited

U.S. PATENT DOCUMENTS 5,010,246 A * 4/1991 Tsuyuguchi et al. ........ 250/216

2005/0151216 A1    7/2005 Shirakawa et al.

FOREIGN PATENT DOCUMENTS

| JP | A 2003-309271 | 10/2003 |
| JP | A 2004-214291 | 7/2004 |
| JP | A 2005-5363 | 1/2005 |
| JP | A 2005-26260 | 1/2005 |
| JP | A 2005-45051 | 2/2005 |
| JP | A 2006-41456 | 2/2006 |

* cited by examiner

*Primary Examiner*—Paul Huber
(74) *Attorney, Agent, or Firm*—Oliff & Berridge, PLC

(57) ABSTRACT

There are provided a light-receiving element for receiving light reflected from an optical recording medium, an optical head using the element, and an optical recording/reproducing apparatus using the element. In particular, the light-receiving element can be manufactured at low cost and in a simple manner and is configured to receive light from a short-wavelength laser source (having a wavelength of 402 nm to 413 nm). The light-receiving element includes a silicon substrate in which a light-receiving portion is formed; a circuit board for mounting the silicon substrate; at least one or more wires for electrically connecting the silicon substrate and the circuit board; a cover layer for covering the wires; and an exposed portion for exposing the light-receiving portion outside.

8 Claims, 5 Drawing Sheets

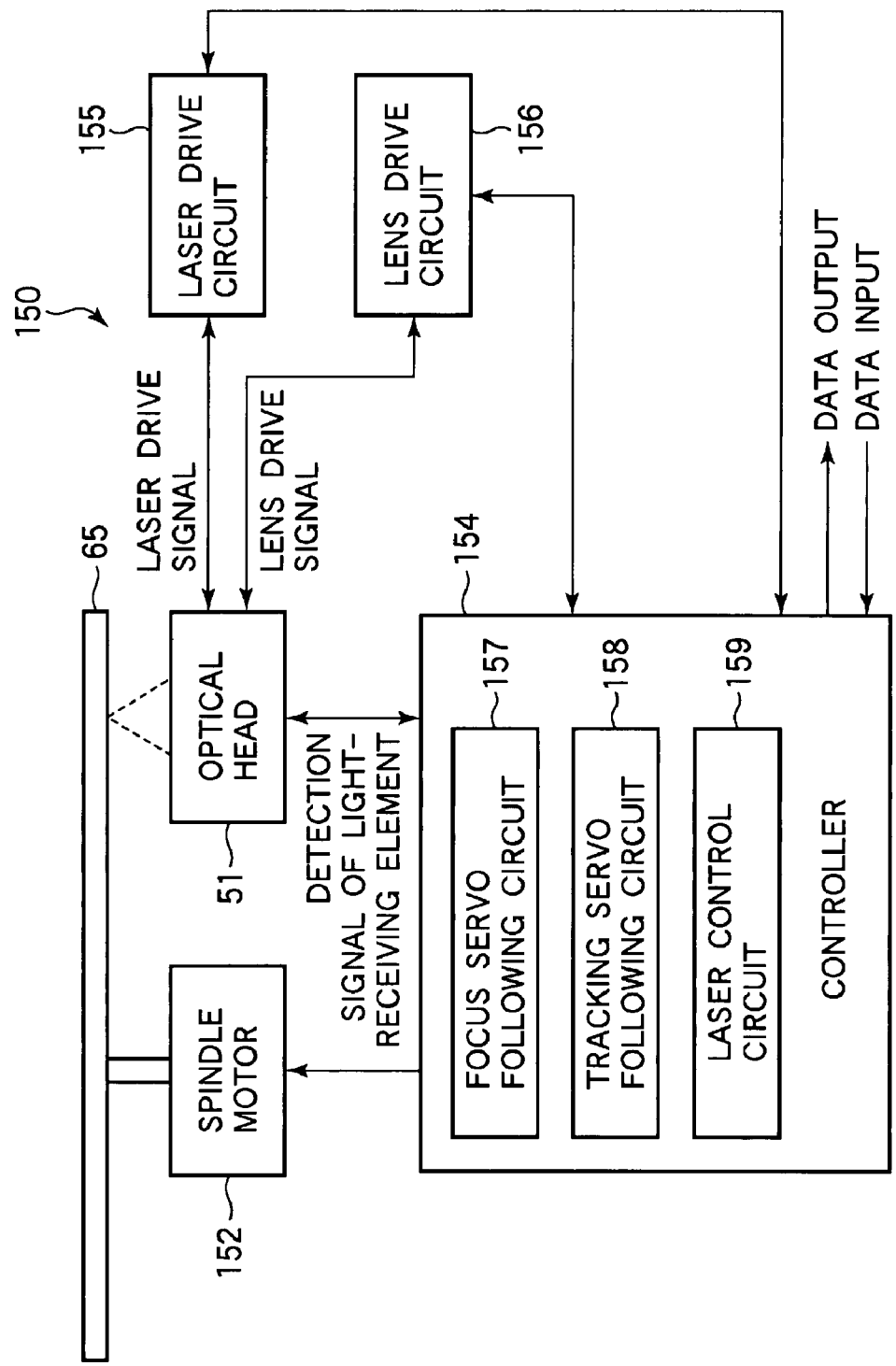

LIGHT-RECEIVING ELEMENT, OPTICAL HEAD USING THE SAME, AND OPTICAL RECORDING/REPRODUCING APPARATUS USING THE SAME

BACKGROUND OF THE INVENTION

1. Field of the Invention

The present invention relates to a light-receiving element for receiving light reflected from an optical recording medium, an optical head using the element, and an optical recording/reproducing apparatus using the element.

2. Description of the Related Art

A light-receiving element used in an optical head has an integrated circuit element in which a light-receiving portion is formed and a circuit board in which the integrated circuit element is mounted. The light-receiving element also has a bonding portion including electrode pads formed on the integrated circuit element, electrode terminals formed on the circuit board, and wires for connecting the electrode pads to the electrode terminals. The light-receiving element also has a cover layer disposed so as to cover an upper side of the light-receiving portion and the bonding portion and extend over the integrated circuit element and the circuit board. The cover layer has functions of protecting wire and relaxing stress. Specifically, the cover layer functions as a protective member that prevents corrosion caused by moisture and short circuit failures in the bonding portion caused by motes, dust, and the like in air.

The light-receiving portion is configured so that it can receive light reflected from an optical recording medium. The light-receiving element converts an amount of the light received by the light-receiving portion into an electric signal by photoelectric conversion, and the light-receiving element outputs the electric signal from the bonding portion. On the basis of the electric signal, a reproducing signal including information recorded on the optical recording medium and an error detection signal used in adjustment of a focusing error or a tracking error of the optical head are generated.

Patent Document 1: JP-A-2005-5363
Patent Document 2: JP-A-2006-41456
Patent Document 3: JP-A-2004-214291
Patent Document 4: JP-A-2005-45051
Patent Document 5: JP-A-2003-309271
Patent Document 6: JP-A-2005-26260

However, in the next generation optical head, it is necessary to shorten a light source wavelength in order to increase recording density. For example, the light source wavelength used in compact disk (CD) apparatus is near 780 nm, but the light source wavelength used in digital versatile disk (DVD) apparatus is near 650 nm. Nowadays, the light source wavelength has been shortened to near 400 nm. Generally, when the light source wavelength is shortened, optical parts' characteristics such as chromatic aberration, transmittance, and durability are varied, those characteristic variation remarkably increases near 400 nm as a boundary wavelength. Accordingly, even when some optical parts are usable in the range of the light source wavelength used in CD apparatus and DVD apparatus, the parts may not be used when using a light source having a wavelength near 400 nm. Specifically, when short-wavelength light having high power is radiated on optical parts, adhesives, and the like using resin for a long time, the resin is chemically changed and the chemical change occasionally causes damages such as a transmittance change, deformation, or the like. Additionally, in order to solve the problem mentioned above, it can be considered that a member using glass instead of resin is disposed on a light path of a laser, but there is a problem that needs high processing costs and assembling costs of the parts.

It is an object of the present invention to provide a light-receiving element that can be manufactured at low cost and in a simple manner and is configured to receive light from a short-wavelength laser source (having a wavelength of 402 nm to 413 nm), an optical head using the element, and an optical recording/reproducing apparatus using the element.

SUMMARY OF THE INVENTION

The above-described object is achieved by a light-receiving element characterized in that it includes, an integrated circuit element in which a light-receiving portion is formed, a circuit board for mounting the integrated circuit element at least one or more wires for electrically connecting the integrated circuit element and the circuit board, and a cover layer for covering the wires and having an exposed portion exposing the light-receiving portion outside.

The invention provides a light-receiving element, characterized in that the light-receiving portion receives short-wavelength laser light.

The invention provides a light-receiving element, characterized in that the integrated circuit element and the circuit board are connected to each other through the wires.

The invention provides a light-receiving element, characterized in that the cover layer is made of an opaque material.

The invention provides a light-receiving element, characterized in that the cover layer is made of epoxy-based resin or silicon-based resin.

The invention provides a light-receiving element, characterized in that a distance between an outer periphery of the light-receiving portion and an inner periphery of the exposed portion is 50 μm or more.

The above-described object is achieved by an optical head including an objective lens for focusing light radiated from the light source on an optical recording medium, and a light-receiving element for receiving the light reflected from the optical recording medium, characterized in that the light-receiving element is the light-receiving element according to the invention.

The above-described object is achieved by an optical recording/reproducing apparatus characterized in that it includes, the optical head according to the invention.

According to the invention, it is possible to achieve a light-receiving element that can be manufactured at low cost and in a simple manner and is configured to receive light from a short-wavelength laser source, an optical head using the element, and an optical recording/reproducing apparatus using the element.

BRIEF DESCRIPTION OF THE DRAWINGS

The above and other features and advantages of the present invention will become more apparent by describing in detail exemplary embodiments thereof with reference to the attached drawings in which:

FIG. 7 is a diagram illustrating a schematic configuration of an optical recording/reproducing apparatus 150 according to an embodiment of the invention.

DESCRIPTION OF THE PREFERRED EMBODIMENT

Hereinafter, a light-receiving element, an optical head using the element, and an optical recording/reproducing apparatus using the element according to an embodiment of the invention will be described with reference to FIGS. 1 to 8. In the embodiment, the light-receiving element 1 used in the optical head will be described as an example. Before describing a structure of the light-receiving element 1 according to the embodiment, a schematic configuration of a known light-receiving element 31 will be described as a comparative example with reference to FIG. 8.

Figure 8:
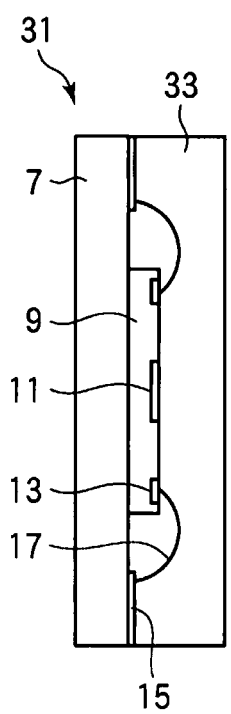
FIG. 8 is a sectional view of a known light-receiving element.

FIG. 8 is a sectional view of the known light-receiving element 31 used in the optical head. In the light-receiving element 31 as shown in FIG. 8, a resin substrate is used as a circuit board 7. A silicon substrate 9 (integrated circuit element) having a thin plate shape is mounted on a substantially central portion of a circuit board 7. The light-receiving element 1 has a light-receiving portion 11 formed in a substantially central portion on a surface of the silicon substrate 9. A transparent protective film (not shown) having a thickness of 0.05 μm to 2 μm is formed on the almost entire surface of the silicon substrate 9 including the light-receiving portion 11. The transparent protective film is made of, for example, $SiO_2$, SiN, SiON, or the like.

The silicon substrate 9 includes a plurality of electrode pads 13 respectively formed along a pair of end sides of the silicon substrate 9 opposed to each other. For example, electrode terminals 15 having the same number of the electrode pads 13 are formed along a pair of end sides of the circuit board 7 opposed to each other, in parallel to the end sides of the silicon substrate 9. The light-receiving element 31 is electrically connected to a mount board (not shown) for mounting the light-receiving element 31, by using the electrode terminals 15. The electrode pads 13 are electrically connected to the electrode terminals 15 by wires 17 which are at least one or more. A bonding portion includes the plurality of electrode pads 13, the plurality of wires 17, and the plurality of electrode terminals 15.

The light-receiving element 31 outputs an electric signal from the electrode pads 13 by performing photoelectric conversion of the light received by light-receiving portion 11. The electric signal is inputted through the wires 17 and the electrode terminals 15 into a predetermined circuit on the mount board on which the light-receiving element 31 is mounted. The silicon substrate 9, the circuit board 7, the electrode pads 13, the wires 17, and the electrode terminals 15 are sealed with a cover layer 33 made of transparent resin. The cover layer 33 protects both the substrates 7 and 9 and the bonding portion from dust, extraneous substances, moisture, and various chemical substances.

Figure 1:
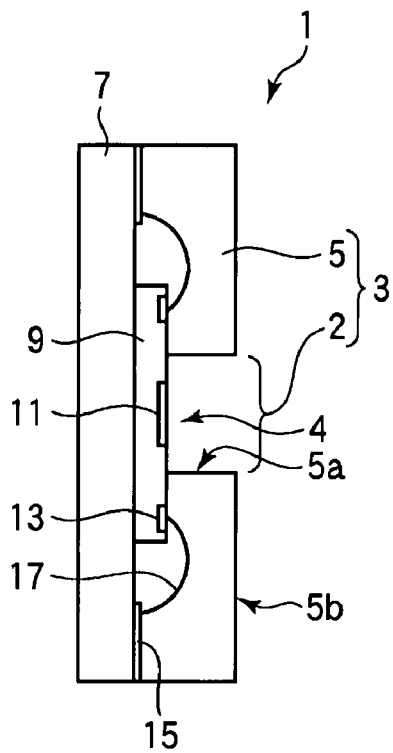
FIG. 1 is a diagram illustrating a schematic configuration of a light-receiving element 1 according to an embodiment of the invention.
Figure 2:
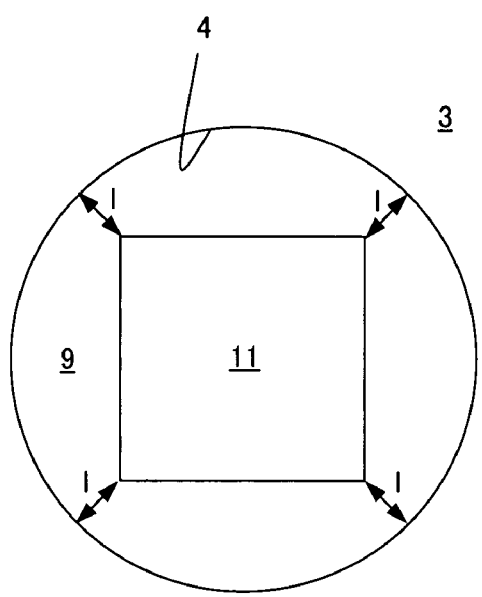
FIG. 2 is an enlarged view illustrating the vicinity of an exposed portion 4 of a light-receiving element 1 according to an embodiment of the invention.

Next, a light-receiving element 1 of the embodiment will be described with reference to FIGS. 1 and 2. FIG. 1 is a sectional view of the light-receiving element 1 cut along the line laid across a central axis of a light-receiving surface of the light-receiving portion 11. FIG. 2 is an enlarged view for enlarging the vicinity of the light-receiving portion 11, as viewed in a normal direction of the surface of the silicon substrate 9 in which the light-receiving portion 11 is formed. As shown in FIG. 1, the light-receiving element 1 for the short-wavelength laser source has the same structure as the known light-receiving element 31, except that the cover layer 3 has a different shape to the cover layer 33 of the known light-receiving element 31. The cover layer 3 has a light blocking region 5 in which the wires 17 is covered, and an exposed portion 4 which is located on the light-receiving portion 11 and in which a light incident region 2 is exposed outside. The cover layer 3 is made of, for example, an opaque resin such as epoxy-based resin or silicon-based resin.

The light-receiving portion 11 is formed on the silicon substrate 9 so as to be exposed outside. There is no existence of resin above the light-receiving portion 11. An inner wall surface 5a of the exposed portion 4 is formed in a circular shape as viewed from upper side. An external surface 5b of a light incident side of the light-blocking region 5 in the cover layer 3 is formed so as to be substantially parallel to the substrate surface of the silicon substrate 9. Since the exposed portion 4 is prepared in which the light-receiving portion 11 is exposed outside, short-wavelength light having high power is not irradiated on resin which is a raw material of the cover layer 3. Therefore, a transmittance change, deformation, or the like caused by chemical change of the resin are prevented, and thus it is possible to contrive to improve performance of the light-receiving element 1. Additionally, the cover layer 3 functions as a sealing resin for protecting the bonding portion that includes the substrate surface of the silicon substrate 9 and wires 17 other than the exposed portion 4 in which the light-receiving portion 11 is exposed outside. For this reason, the cover layer 3 can maintain reliability equal to cover layer 33 of the known light-receiving element 31 that is configured to seal the entire surface thereof with transparent resin.

When the light-receiving element is disposed in the optical head and an objective lens in the optical head is disposed on the light-receiving element, the light-receiving element is mostly disposed perpendicularly, as viewed in the direction of disposing the optical head. That is, the light-receiving surface of the light-receiving element is disposed in parallel to the vertical direction. For this reason, it can be thought that few particulates are naturally deposited by weight on the light-receiving element. Inspecting grit and dust that exist in indoor air, it can be found that the particulates are roughly divided into cotton dust and fugitive dust. Since the cotton dust is larger than the fugitive dust, the cotton dust scarcely enters inside the optical head. From the result of a dust test performed on the light-receiving element for a long time when a dust tester makes the situation similar to practical environment for use thereof in consideration of the fugitive dust, it can be found that the fugitive dust having a diameter of about 30 μm may be attached thereto. Since the fugitive dust is large and heavy, it can be thought that the fugitive dust moves along the sealing resin (cover layer) as penetration path. Accordingly, as shown in FIG. 2, an outer periphery of the light-receiving portion 11 on the silicon substrate 9 and an inner periphery of the exposed portion 4 on the silicon substrate 9 are disposed at the least distance l of 50 μm or more away from each other. With such a configuration, it can be prevented that the fugitive dust reaches to the light-receiving portion 11. In the embodiment, the light-receiving portion 11 has a substantially square shape, and the exposed portion 4 has a substantially circular shape, as viewed in a normal direction of the substrate surface of the silicon substrate 9. Therefore, the least distance l is a distance from outer peripheral corners of the light-receiving portion 11 to an inner periphery of the exposed portion 4 on the silicon substrate 9. With such a configuration, performance of the light-receiving element 1 can be maintained. Additionally, the light-receiving element in FIG. 2 includes the exposed portion having a circular shape, but it may include an exposed portion having a rectangular shape.

Next, a method of manufacturing a light-receiving element 1 according to the embodiment will be briefly described. A silicon wafer having light-receiving portions 11 formed thereon is individually separated dicing. Picking up each of the separated silicon substrate 9, a rear surface side of the substrate surface of the silicon substrate 9 having the light-receiving portion 11 formed thereon is mounted on the circuit board 9 by an adhesive. After drying the adhesive, the electrode pads 13 of the silicon substrate 9 and the electrode terminals 15 of the circuit board 7 are connected to each other via the wires 17. To protect a wiring portion (the bonding portion) including the wires 17, the wiring portion is sealed with sealing resin. After the sealing, the resin is dried. With such a method, there is provided the light-receiving element 1 that is configured to cover the wiring portion with the cover layer 3 and includes the exposed portion 4 for exposing the light-receiving portion 11 outside. In the present manufacturing method, since there is no complicated method such as a method of a bump connection between the silicon substrate 9 and circuit board 7, it is not necessary to use manufacturing apparatuses having high costs, and thus it is possible to suppress costs of manufacturing facilities. For example, the resin is coated not by automatic coating apparatus but by manual work, thereby it is possible to suppress costs of manufacturing facilities.

Additionally, a method as follows can be adopted as a method of forming the exposed portion 4. A silicon wafer having light-receiving portions 11 formed thereon is individually separated by dicing. Picking up each of the separated silicon substrate 9, a rear surface side of the substrate surface of the silicon substrate 9 having the light-receiving portion 11 formed thereon is mounted on the circuit board 7 by an adhesive. After drying the adhesive, a region, which will becomes the exposed portion 4 later, is coated on the light-receiving portion 11 by a water-soluble resin material. Then, the electrode pads 13 of the silicon substrate 9 and the electrode terminals 15 of the circuit board 7 are connected to each other by the wires 17. After that, the wiring portion is sealed with sealing resin to protect the wires 17. After drying the sealing resin, the resin for covering up the light-receiving portion 11 is removed by water washing, and then the light-receiving element 1 in which the wiring portion is covered with the cover layer 3 and which has the exposed portion 4 for exposing the light-receiving portion 11 outside is completely formed. A material for covering up the light-receiving portion 11 may be resin or metal. In addition, the portion for temporarily covering the region of the exposed portion 4 may be removed by etching. By using this method, geometry of the exposed portion 4 can be controlled. Indirectly, this method can improve mass productivity of the resin sealing and the like.

According to the invention as described above, the light-receiving element 1 includes the cover layer 3 for sealing the wiring portion and the exposed portion 4 for exposing the light-receiving portion 11 outside. With such a configuration, in the light-receiving element 1, it can be prevented that deterioration of the cover layer 3 is caused by laser light since the laser light is not irradiated on the cover layer 3. Therefore, the light-receiving element 1 can be used as a light-receiving element for a short-wavelength laser source.

In Patent Document 5, a light-receiving element of a structure having an opening portion formed on a light-receiving portion is disclosed. However, the light-receiving element has problems as follows: (1) Manufacture is difficult because of the structure that a plurality of substrates is superposed one over the other; (2) The structure thereof is different from the light-receiving element 1 of the embodiment because of the structure that a substrate having an opening portion is above the light-receiving portion; (3) It is difficult to contrive a decrease in thickness as compared with the light-receiving element of the embodiment since the substrate having the opening portion also has a function of a wiring layer; (4) Component costs thereof increases since it is necessary to additionally prepare a substrate for supporting a silicon substrate; (5) It is difficult to choose resin for relaxing stress of connecting portion; and (6) It is difficult to inspect the connecting portion and the opening portion.

The light-receiving element 1 according to the embodiment has a simple structure that the silicon substrate 9 is mounted on the circuit board 7 by the adhesive. Manufacturing costs is low since the circuit board 7 and the silicon substrate 9 are connected to each other via the wires 17. The exposed portion 4 can be formed, by protecting the wiring portion by using the liquid-phase sealing material having high viscosity. Inspection is simple since sealing condition of the resin and size of the exposed portion 4 can be checked with eyes.

Additionally, in Patent Document 6, a light-receiving element of a structure having an opening portion formed on a light-receiving portion is disclosed. However, the light-receiving element has problems as follows: (1) Facility costs are high since a mold for molding resin is necessary; (2) It is difficult to form an opening portion in the manner of resin sealing by using the molding; and (3) There is a problem that it is difficult to decrease in thickness and size since a package is increased in thickness and size by thickness of the resin on rear surface portions of a lead frame and the light-receiving element. In the embodiment, the facility costs decrease since the mold is not necessary. Additionally, feasibility is high and manufacture is easy since the cover layer 3 is formed by dropping liquid-phase resin. In the embodiment, there is no resin on the rear surface of the circuit board 7, so it is possible to contrive a decrease in thickness, and thus the structure is adequate for a thin-type optical head.

According to the embodiment as described above, the light-receiving element used in the optical head can be manufactured at low cost and in a simple manner. Additionally, although the exposed portion 4 for exposing the light-receiving portion 11 outside is provided to the light-receiving element 1, it is possible to prevent attachment of dust and motes and thus to sufficiently perform functions as a light-receiving element.

Figure 3:
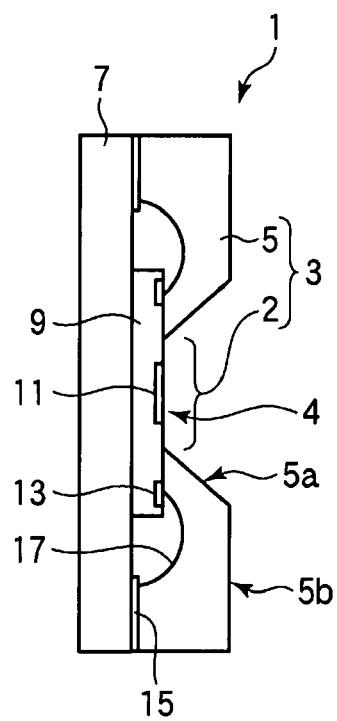
FIG. 3 is a sectional view of a light-receiving element 1 according to a first modified example of an embodiment of the invention.
Figure 4:
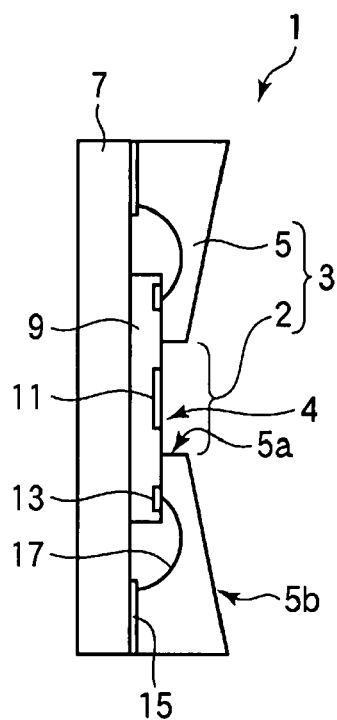
FIG. 4 is a sectional view of a light-receiving element 1 of a second modified example of an embodiment of the invention.
Figure 5:
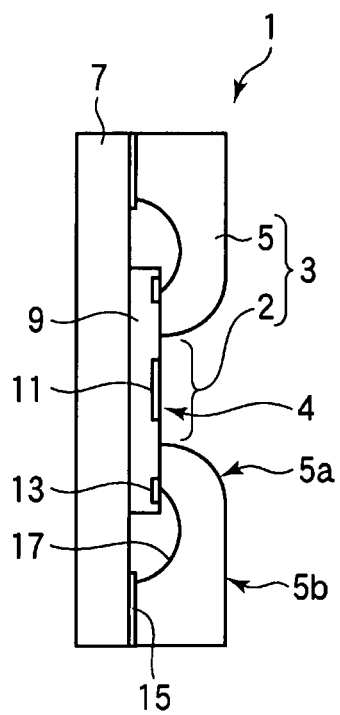
FIG. 5 is a sectional view of a light-receiving element 1 of a third modified example of an embodiment of the invention.

Next, a schematic configuration of the light-receiving element 1 according to a modified example of the embodiment will be described. FIGS. 3 to 5 illustrate light-receiving elements 1 according to first to third modified examples, respectively. FIGS. 3 to 5 are sectional views of the light-receiving elements 1 cut along the line laid across a central axis of a light-receiving surface of the light-receiving portion 11. The light-receiving element 1 according to the first to the third modified examples are characterized in that a shape of the vicinity of an exposed portion 4 in a cover layer 3 is different from that of the light-receiving element 1 illustrated in FIG. 1.

In the section as shown in FIG. 3, the light-receiving element 1 according to the first modified example includes a cover layer 3 in which an inner wall surface 5a of an exposed portion 4 is formed as a slope. For example, the inner wall surface 5a is formed in a mortar shape. In the section as shown in FIG. 4, the light-receiving element 1 according to the second modified example includes a cover layer 3 in which an external surface 5b of a light blocking region 5 is formed as a slope. In the section as shown in FIG. 5, the light-receiving element 1 according to the third modified example includes a cover layer 3 in which an inner wall surface 5a of an exposed portion 4 is formed in a curved shape.

In these sections, the light-receiving element 1 according to the first to third modified examples includes the cover layer 3 in which any one of the inner wall surface 5a of the exposed portion 4 or the external surface 5b of the light blocking region 5 is formed as a slope. With such a configuration, it can be prevented that dust entering into the exposed portion 4 and staying therein reaches to the light-receiving portion 11. For example, the light-receiving element 1 of the third modified example has a preferable shape in that the inner wall surface 5a of the exposed portion 4 is formed in a gentle arc so that the dust penetrating into the exposed portion 4 hardly stays therein.

Figure 6:
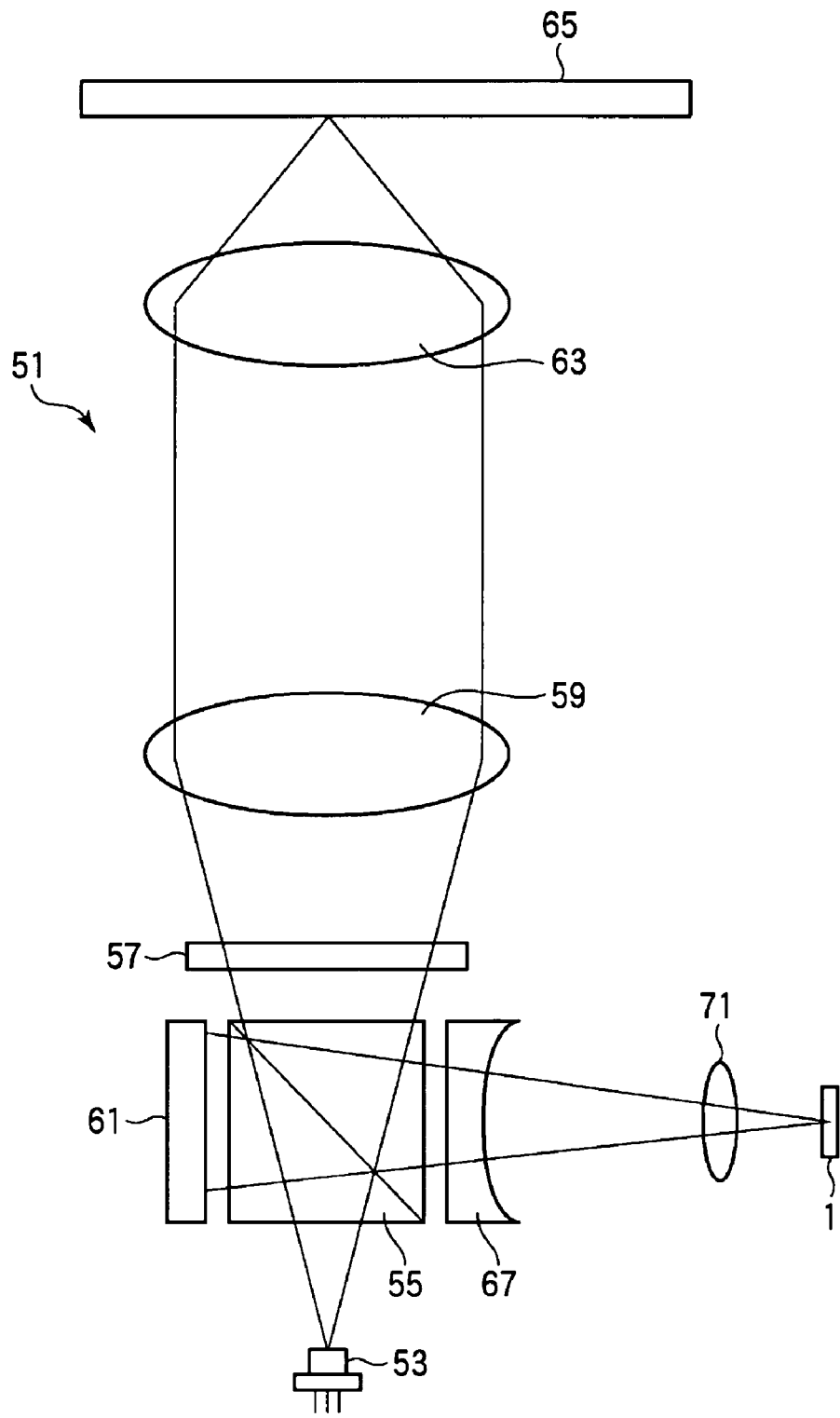
FIG. 6 is a diagram illustrating a schematic configuration of an optical head 51 according to an embodiment of the invention.

Next, a schematic configuration of the optical head according to the embodiment will be described with reference to FIG. 6. The optical head 51 is a laser-emitting element for emitting a laser beam, and includes a laser diode 53, for example. The laser diode 53 is operable to emit laser beams having different intensity for every recording/reproducing operation on the basis of control voltage of the controller (not shown in FIG. 6).

A polarized beam splitter 55 is disposed on a predetermined position of a light emitting side of the laser diode 53. In a light transmitting side of the polarized beam splitter 55 as viewed from the laser diode 53, a quarter wavelength plate 57, a collimator lens 59, and an objective lens 63 is arranged in this order so as to be parallel to each other. In a light reflecting side of the polarized beam splitter 55 as viewed from the laser diode 53, a photo diode 61 used in a power monitor for measuring light intensity of a laser beam emitted from the laser diode 53 is disposed. The collimator lens 59 is provided in order to guide into the objective lens 63 by converting a divergent beam from the laser diode 53 into a parallel beam, and guide into the light-receiving element 1 by converting the parallel beam from the objective lens 63 into convergent beam. The objective lens 63 is provided in order to form a reading spot by focusing the parallel beam from the collimator lens 59 upon an information-recording surface of an optical recording medium 65, and guide into the collimator lens 59 by converting reflected light from the optical recording medium 65 into a parallel beam.

In a light reflecting side of the polarized beam splitter 55 as viewed from the quarter wavelength plate 57, a sensor lens 67 and cylindrical lens 71 is arranged alongside in this order. In a light transmitting side of the cylindrical lens 71, the light-receiving element 1 for receiving the reflected light from the optical recording medium 65 is disposed. When using the light-receiving element 1 in a practical situation, the substrate surface of the silicon substrate 9 (see FIG. 1) on which the light-receiving portion 11 is formed is disposed in an almost vertical direction.

The sensor lens 67 functions as a reflected-light focus-adjusting portion for optically adjusting a focusing position of the light reflected from the optical recording medium 65. Additionally, the sensor lens 67 is operable to cause astigmatism in the reflected light from the optical recording medium 65, and to image the reflected light on the light-receiving portion 11 of the light-receiving element 1 by using a predetermined optical magnification. The electric signal obtained by photoelectric conversion in the light-receiving element 1 is processed in a predetermined circuit belonging to the optical recording/reproducing apparatus that is not shown, whereby a reproducing signal including information recorded on the optical recording medium 65 may be extracted and an error detection signal for adjusting a focusing error or a tracking error of the optical head 51 may be generated. The light-receiving element 1 includes the exposed portion 4 for exposing the light-receiving portion 11. With such a configuration, short-wavelength light having high power is not irradiated on resin which is a raw material of the cover layer 3, and thus a transmittance change, deformation, or the like caused by chemical change of the resin are prevented. For this reason, the light-receiving element 1 performs photoelectric conversion on light having a sufficient amount of light, and thus it is not possible to output electric signals having high quality. With such a configuration, the reproducing signal and the error detection signal generated on the basis of the electric signal does not undergo time degradation, and initial quality of those signals are kept up.

Next, an operation of the optical head 51 will be described. A laser beam of divergent light emitted from the laser diode 53 is incident on the polarized beam splitter 55. In the polarized beam splitter 55, a linear polarized component in a predetermined polarized direction is transmitted, and the linear polarized component is incident on the quarter wavelength plate 57. On the other hand, a linear polarized component orthogonal to the predetermined polarized direction is reflected, the linear polarized component is incident on the photo diode 61 for the power monitor application, and the laser beam intensity is measured.

The linear polarized light incident on the quarter wavelength plate 57 is transformed into a circular polarized light after passing through the quarter wavelength plate 57. The circular polarized light is converted into parallel light via the collimator lens 59, passes through the collimator lens 59, is converged via the objective lens 63, and is incident on a recording layer of the optical recording medium 65. The circular polarized light reflected from the recording layer of the optical recording medium 65 is converted into parallel light via the objective lens 63, passes through the collimator lens 59, and is incident on the quarter wavelength plate 57. By passing through the quarter wavelength plate 57, the circular polarized light is transformed into linear polarized light of which polarized direction is rotated by 90° with respect to the initial linear-polarized light, and is incident on the polarized beam splitter 55. The linear polarized light is reflected from the polarized beam splitter 55, and is incident on the sensor lens 67.

The light passing though the sensor lens 67 is incident on the cylindrical lens 71. The light incident on the cylindrical lens 71 is focused on the light-receiving portion 11 of the light-receiving element 1. In the light-receiving element 1, short-wavelength light having high power is not irradiated by the exposed portion 4 on resin which is a raw material of the cover layer 3, and thus a transmittance change, deformation, or the like caused by chemical change of the resin are prevented. In order to generate the reproducing signal and the error detection signal, the electric signal obtained by performing the photoelectric conversion of the received light in the light-receiving element 1 is outputted to a predetermined circuit included in the optical recording/reproducing apparatus.

Next, the optical recording/reproducing apparatus according to an embodiment will be described with reference to FIG. 7. For example, the optical recording/reproducing apparatus includes an optical head device for recording information in predetermined regions of a plurality of tracks formed along the circumferential direction of a disk-shaped optical recording medium so as to repeat in the radial direction of the optical recording medium and for reproducing information recorded in predetermined regions of the tracks. As for the optical head, there is a record-only type for recording information only upon the optical recording medium, a reproduce-only type for reproducing information only, and a record/reproduce type for both recording and reproducing. Accordingly, including optical recording apparatus, optical reproducing apparatus, and optical recording/reproducing apparatus, which are equipped with the optical head types, respectively, it is referred to as the optical recording/reproducing apparatus.

FIG. 7 is a diagram illustrating a schematic configuration of an optical recording/reproducing apparatus 150 equipped with an optical head 51 according to the embodiment. As shown in FIG. 7, the optical recording/reproducing apparatus 150 includes a spindle motor 152 for rotating the optical recording medium 65, an optical head 51 for receiving the reflected light while irradiating a laser beam on the optical recording medium 65, a controller 154 for controlling the spindle motor 152 and the optical head 51, a laser drive circuit 155 for supplying a laser drive signal to the optical head 51, and a lens drive circuit 156 for supplying a lens drive signal to the optical head 51. When using the light-receiving element 1 (see FIG. 1) included in the optical head 51 in a practical situation, the substrate surface of the silicon substrate 9 (see FIG. 1) on which the light-receiving portion 11 is formed is disposed in a substantially vertical direction.

The controller 154 includes a focus servo following circuit 157, a tracking servo following circuit 158, and a laser control circuit 159. When the focus servo following circuit 157 is operated, a laser beam is focused on an information-recording surface of the rotating optical recording medium 65. When the tracking servo following circuit 158 is operated, a laser beam spot automatically follows eccentric signal tracks on the optical recording medium 65. The focus servo following circuit 157 and the tracking servo following circuit 158 have auto gain control functions for automatically adjusting a focus gain and a tracking gain, respectively. Additionally the laser control circuit 159 is a circuit for generating the laser drive signal supplied by the laser drive circuit 155, and generates an adequate laser drive signal on the basis of information of record condition setting recorded on the optical recording medium 65.

The focus servo following circuit 157, the tracking servo following circuit 158, and the laser control circuit 159 are not necessary to be a circuit built in the controller 154, and may be configured as a separate component independent from the controller 154. Additionally, those are not necessary to be a physical circuit, and may be configured as software executed by the controller 154.

The invention is not limited to the embodiments mentioned above, and may be modified to various forms.

For example, a flexible printed circuit board (FPC) is available in the circuit board 7 of the light-receiving element 1. Using the FPC, the substrate for supporting the silicon substrate 9 is not necessary, and thus the light-receiving element 1 can be formed thinner. With such a configuration, the light-receiving element 1 can be made to be thin and light while maintaining degree of freedom in connection. Since a small-sized light-receiving element is required for a thin-type optical head, it is possible to mount the light-receiving element 1 on the thin-type optical head.

Additionally, as long as the silicon substrate 9 includes the light-receiving portion 11, the integrated circuit element is not limited to the silicon substrate. For example, instead of the silicon substrate 9, by using a substrate made of a Gallium Nitride semiconductor (GaN) which is a compound semiconductor, with the light-receiving portion 11 formed thereon, it is possible to obtain the same advantages as the aforementioned embodiments.

What is claimed is:

1. A light-receiving element comprising:
    an integrated circuit element in which a light-receiving portion is formed;
    a circuit board for mounting the integrated circuit element;
    at least one or more wires for electrically connecting the integrated circuit element and the circuit board; and
    a cover layer for covering the wires and having an exposed portion exposing the light-receiving portion outside, wherein an inner wall surface of the exposed portion is formed in a curved shape in a section of the cover layer cut along a line laid across a central axis of a light-receiving surface of the light-receiving portion.

2. The light-receiving element according to claim 1, wherein the light-receiving portion receives short-wavelength laser light.

3. The light-receiving element according to claim 1, wherein the integrated circuit element and the circuit board are connected to each other through the wires.

4. The light-receiving element according to claim 1, wherein the cover layer is made of an opaque material.

5. The light-receiving element according to claim 1, wherein the cover layer is made of epoxy-based resin or silicon-based resin.

6. The light-receiving element according to claim 1, wherein a distance between an outer periphery of the light-receiving portion and an inner periphery of the exposed portion is 50 μm or more.

7. An optical head comprising:
    an objective lens for focusing light radiated from a light source on an optical recording medium; and
    a light-receiving element for receiving light reflected from the optical recording medium,
    wherein the light-receiving element is the light-receiving element according to claim 1.

8. An optical recording/reproducing apparatus comprising the optical head according to claim 7.

* * * * *